(12) United States Patent
Schulze et al.

(10) Patent No.: US 6,607,972 B2
(45) Date of Patent: Aug. 19, 2003

(54) METHOD FOR PRODUCING AN EDGE TERMINATION SUITABLE FOR HIGH VOLTAGES IN A BASIC MATERIAL WAFER PREFABRICATED ACCORDING TO THE PRINCIPLE OF LATERAL CHARGE COMPENSATION

(75) Inventors: Hans-Joachim Schulze, Ottobrunn (DE); Gerald Deboy, Unterhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/974,937

(22) Filed: Oct. 10, 2001

(65) Prior Publication Data

US 2002/0037636 A1 Mar. 28, 2002

Related U.S. Application Data

(63) Continuation of application No. PCT/EP00/08708, filed on Sep. 6, 2000.

(30) Foreign Application Priority Data

Sep. 7, 1999 (DE) .......................................... 199 42 679

(51) Int. Cl.$^7$ ........................... H01L 21/04; H01L 23/58
(52) U.S. Cl. ........................ 438/510; 438/414; 438/418; 257/487
(58) Field of Search .................................. 257/471, 481, 257/487; 148/171, 177, 189; 438/203, 40, 284, 510, 286, 414, 418; 29/576

(56) References Cited

U.S. PATENT DOCUMENTS

| | | | | |
|---|---|---|---|---|
| 3,919,010 A | * | 11/1975 | Borchert et al. | ............ 148/33.5 |
| 4,063,966 A | * | 12/1977 | Anthony et al. | ............... 117/40 |
| 4,672,738 A | * | 6/1987 | Stengl et al. | ......... 148/DIG. 10 |
| 5,597,765 A | * | 1/1997 | Yilmaz et al. | ......... 257/29.009 |
| 6,242,784 B1 | * | 6/2001 | Zeng et al. | .................. 257/409 |
| 6,512,268 B1 | * | 1/2003 | Ueno | .......................... 257/341 |

FOREIGN PATENT DOCUMENTS

DE     196 04 043 A1    8/1997

* cited by examiner

Primary Examiner—Carl Whitehead, Jr.
Assistant Examiner—David L. Hogans
(74) Attorney, Agent, or Firm—Laurence A. Greenberg; Werner H. Stemer; Ralph E. Locher

(57) ABSTRACT

An edge termination is produced that is capable of handling high voltages. The edge termination is produced in a base material wafer that is produced in accordance with the principle of lateral charge compensation. The edge termination is formed in the base material wafer by implanting a rapidly diffusing dopant. Preferred dopants are selenium and sulfur. The high-voltage withstand strength is effected by a resulting doping profile which increases towards the edge termination.

6 Claims, 1 Drawing Sheet

METHOD FOR PRODUCING AN EDGE TERMINATION SUITABLE FOR HIGH VOLTAGES IN A BASIC MATERIAL WAFER PREFABRICATED ACCORDING TO THE PRINCIPLE OF LATERAL CHARGE COMPENSATION

CROSS-REFERENCE TO RELATED APPLICATION

This is a continuation of copending International Application PCT/EP00/08708, filed Sep. 6, 2000, which designated the U.S.

BACKGROUND OF THE INVENTION

FIELD OF THE INVENTION

The invention relates to a method for producing an edge termination suitable for high voltages in a basic material wafer prefabricated according to the principle of lateral charge compensation.

Compensation components are expected in the very near future to take a large market share in the segment of MOS components having a high blocking capability. At the present time, the production of such compensation components is still extremely complicated and time-consuming. This can be attributed to the fact that the structure for example of a transistor to be fabricated already has to be taken into account in the processing of the basic material. This means, for example, that, in the region of the gate pad and of the edge termination of such a transistor, the basic material has to be processed in a different way than in the active cell array of the transistor. If a compensation transistor which is intended to block 600 V, for example, is produced using the hitherto preferably employed construction technique comprising a series of implantation and epitaxy steps, then the processing of the basic material takes a long time, in order that the basic material can be prepared in the respectively desired manner in the active cell array and in the region of the gate pad and also of the edge termination.

If the construction technique comprising a series of implantation and epitaxy steps is employed through the other conceivable basic material processing technique with etching of a substrate and filling of deep etched trenches then the use of a highly doped n-conducting basic material will scarcely be possible since, in the case of an edge termination, the compensation of this basic material by the trenches filled with p-conducting semiconductor material must gradually recede. Separating trenches or blind holes and increasing the distance between concentric trenches appear to be not very promising at the present time. This is attributable to etching attacks of different magnitude during the deep etching of the trenches or blind holes and concentric trenches and also to crystal-orientation-dependent epitaxy deposition rates in the curves of the concentric trenches. It is likewise not desirable for the extent of etching to be gradually reduced toward the outside in the case of a compensation component, for reasons of fabrication tolerances and on account of the dependence of the etching depth on the opening area of the corresponding trench or blind hole.

For all these reasons, intrinsic compensation components will thus be able to be produced economically only in accordance with a concept which proceeds from an undoped or very lightly doped, in particular n-conducting, basic material into which n-conducting and p-conducting epitaxial layers must be introduced via trenches.

However, economical production of compensation components should be possible, in principle, when it can be subdivided, as in the case of existing MOS components, into two blocks, namely the production of the basic material, on the one hand, and the fabrication of the individual components from the basic material, on the other hand. This is because the production of the basic material thus becomes independent of the component that is to be fabricated later, i.e. of the chip area of the component and the precise dimensions of the component. This independence then also enables the production to be performed separately in accordance with the two blocks. This separation of the production process for compensation components has not been possible hitherto since the components, as has already been explained above, presuppose basic material that is prepared in a different way, in particular for edge termination and cell array, so that the precise dimensions of the individual compensation components to be fabricated from this basic material already have to be taken into account during the production of the basic material.

A solution to this fundamental problem with regard to economical production of compensation components has not been found hitherto.

SUMMARY OF THE INVENTION

It is accordingly an object of the invention to provide a method of producing a high-voltage proof edge termination in a base material wafer produced in accordance with the principle of lateral charge compensation, which overcomes the above-mentioned disadvantages of the heretofore-known devices and methods of this general type and which produced an edge termination suitable for high voltages in a basic material wafer prefabricated according to the principle of lateral charge compensation, so that compensation components having any desired dimensions and nevertheless edge terminations suitable for high voltages can be produced from the basic material wafer.

With the foregoing and other objects in view there is provided, in accordance with the invention, a method of producing an edge termination suitable for high voltages in a basic material wafer prefabricated according to the principle of lateral charge compensation. The method comprises the following steps:

prefabricating a basic material wafer by producing a fixed grid of regions of a first conductivity type and regions of a second conductivity type, opposite to the first conductivity type, such that charge compensation is substantially present in a lateral direction in the basic material wafer; and introducing a rapidly diffusing dopant (either of one or of the opposite conductivity type) into edge regions of a compensation component to be produced from the basic material wafer, so that, in the edge regions of the compensation component to be produced, a doping of the rapidly diffusing dopant predominates over a doping of the regions of the opposite conductivity type to the edge regions.

In other words, the objects of the invention are achieved as follows:

prefabrication of the basic material wafer by producing a fixed grid of regions of one conductivity type and regions of the other conductivity type, opposite to the one conductivity type, in such a way that charge compensation is essentially present in the lateral direction in the basic material wafer, and introduction of a rapidly diffusing dopant of one or the other conductivity type into edge regions of a compensation component to be produced from the basic material wafer, with the result that, in these edge regions, the doping of this dopant predominates over the doping of the regions of the opposite conductivity type to the edge regions.

In accordance with an added feature of the invention, selenium or sulfur is preferably used for the rapidly diffusing dopant.

The construction technique with a series of implantation and epitaxy steps is preferably used for the prefabrication of the basic material. However, it is equally possible, for this purpose, to proceed from a semiconductor substrate of one conductivity type and to etch deep trenches into it, which trenches are then filled with semiconductor material of the other conductivity type.

The method according to the invention makes it possible to separate the production process for compensation components into two blocks: in a first block, it is possible to configure the entire basic material with a fixed grid of p-conducting regions and n-conducting regions. In this case, the position of gate pads, edge termination and sawing frame is completely disregarded.

In a second block, the edge termination and, if appropriate, the gate pad is then configured. For this purpose, for example in the case of an n-conducting basic material wafer into which p-conducting regions are introduced, it is necessary, for the individual chips, to alter the compensation that was originally established over the entire basic material wafer slowly in the direction of weak n-type doping toward the edge. In this case, on account of the fabrication tolerances for the basic material wafer, the compensation of the basic material wafer may be slightly p-loaded, intrinsic or slightly n-loaded, the magnitude of the net doping, at least cumulated over the entire active volume of the basic material wafer, lying below or at most being equal to the doping of a standard transistor with the same reverse voltage. If a customary field plate and oxide step construction is applied to a compensation component with a basic material configured in this way as edge termination, a satisfactory blocking behavior of the edge is produced only in the case of slight n-type loading of the doping of the basic material, but in no way over the entire range of possible fluctuations of the degree of compensation.

This insight is advantageously exploited in the method according to the invention: after the uniform prefabrication of the basic material wafer from a fixed grid of regions of one conductivity type and regions of the other conductivity type, preferably of p-conducting pillar-shaped regions in an n-conducting silicon substrate, an additional n-conducting doping is introduced for the edge termination and the sawing frame of compensation components to be produced from the basic material wafer. This is done from the surface of the basic material wafer using a material that diffuses very rapidly, such as, in particular, selenium or sulfur. This is because the diffusion constant of selenium or sulfur is about 6 orders of magnitude greater than the diffusion constant of, for example, phosphorus.

In accordance with an added feature of the invention, the dopant is introduced by ion implantation via a mask having openings of different widths, preferably via a VLD mask. That is, in order to produce an n-conducting doping profile which rises laterally toward the edge, it is possible to implant selenium and/or sulfur, for example, via a mask having openings of different widths in accordance with the so-called "VLD technique". In this case, "VLD" denotes "variable lateral doping", in which a mask is used which has implantation openings that widen from zero toward the outside. In this case, selenium as dopant is even more advantageous than sulfur since its solubility in silicon is sufficiently high and lies above $10^{15}$ cm$^{-3}$. The solubility of sulfur in silicon is lower, but can be increased, if appropriate, by raising the temperature during the drive-in.

In accordance with a concomitant feature of the invention, the following relationship holds true in the edge region defined between an edge A and a beginning C of a cell array:

$$\int_C^A \rho(x)dx > 1.5 q_c$$

where $\rho(x)$ is a charge density in the edge region and $q_c$, is a critical charge of the edge region.

In a compensation component with an n-conducting silicon substrate and p-conducting pillars introduced therein, high concentrations of n-conducting dopant, that is to say preferably selenium or sulfur, are necessary especially in the region of the sawing frame for the individual chips, in order to avoid expansion of the space charge zone beyond the chips. This profile is intended to decrease laterally toward the cell array of the chip, and its depth is intended to reach the n+-conducting silicon substrate. This means a penetration depth of at least 40 $\mu$m using a standard diffusion step, as is customary in power electronics at 1150° C., for example, for 400 minutes. Selenium and sulfur readily meet these conditions as materials that diffuse extremely rapidly.

The activation energies of selenium and sulfur are relatively high and are about 250 meV for selenium. This leads to only incomplete ionization at room temperature, and thus to an exclusion of these materials for the current-conducting, active region of the transistor. This property is not important for the blocking behavior, however, since the mobile charge carriers in the conduction band are immediately removed in the space charge zone, so that there is no thermal equilibrium between conduction band and defect band.

Other features which are considered as characteristic for the invention are set forth in the appended claims.

Although the invention is illustrated and described herein as embodied in a method for producing an edge termination suitable for high voltages in a basic material wafer prefabricated according to the principle of lateral charge compensation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
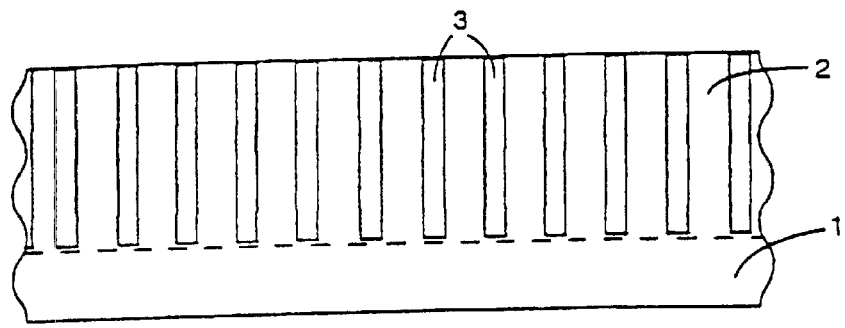
FIGS. 1 and 2 are schematic sectional diagrams through a basic material wafer for illustrating the method according to the invention.

Referring now to the figures of the drawing in detail and first, particularly, to FIG. 1 thereof, there is shown a section through a basic material wafer comprising an n+-conducting silicon substrate 1 on which an n-conducting region 2 is applied by means of the construction technique through a series of implantation and epitaxy steps, a multiplicity of p-conducting pillar-like regions 3 being provided in the former region. In order to produce this basic material wafer, it is also possible, if appropriate, readily to proceed from a semiconductor body made of n-conducting silicon, into which deep trenches are introduced and then filled with p-conducting silicon.

A multiplicity of chips with individual compensation components, in particular transistors, are intended to be produced, by sawing, from the basic material wafer which is shown in FIG. 1 and is uniformly and regularly provided with the p-conducting regions 3. As has already been explained above, the transistors require an edge termination in which the doping is n-loaded and rises toward the edge.

Figure 2:
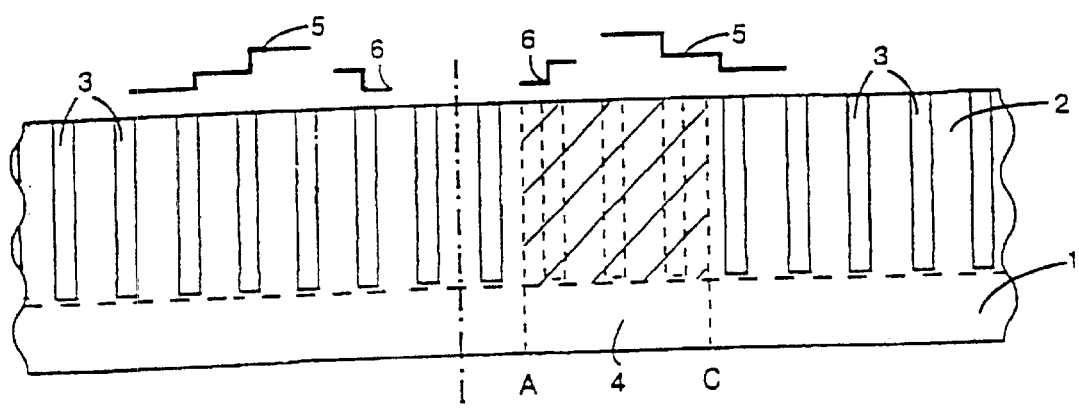
Figure 3:
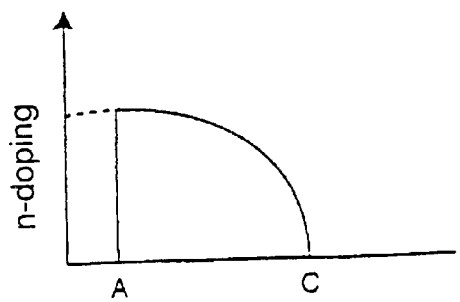
FIG. 3 is a doping profile diagram in an edge termination in the case of the basic material wafer of FIG. 2.

For this purpose, in the method according to the invention, an n-type doping comprising selenium or sulfur is introduced into the basic material wafer in the region of the edge termination (and, if appropriate, of the sawing frame) of a compensation component, in particular transistor, to be produced, in such a way that the doping, as is shown in FIGS. 2 and 3, decreases (cf. point C in FIGS. 2 and 3) from an edge (cf. point A in FIGS. 2 and 3) toward the cell array of the transistor, this being possible for example by means of implantation via a mask having openings of different widths. An n-conducting region 4 is produced in this way, in which region the doping concentration of the n-conducting dopant, that is to say selenium or sulfur, continuously decreases to a greater or lesser extent from the edge (point A) as far as the beginning of the cell array (point C). The decrease is schematically shown for the profile of the n-type doping in FIG. 3.

If appropriate, the n-conducting region 4 can also extend beyond the point A into a sawing frame which follows to the left of the point A in FIG. 2 and is represented by a dash-dotted line. In a mirror-inverted manner with respect to this sawing frame there then follows the edge termination of another component with a channel stopper 6, an edge termination field plate 5 and a region 4. The latter is not illustrated for reasons of clarity.

The method according to the invention enables economical production of compensation components: in a first block, the basic material wafer is produced, as is shown in FIG. 1. In a second block there then follows the production of the edge termination for individual compensation components in the basic material wafer at any desired locations thereof. In this case, the edge termination is particularly simple owing to the rapid diffusion of selenium or sulfur in the basic material wafer.

After production of the n-conducting regions 4, the edge termination field plate 5 and the channel stopper 6 above the n-conducting region 4 are then also formed in a customary manner, as is indicated schematically in FIG. 2.

The following inequality essentially applies to the doping in the n-conducting region 4:

$$\int_C^A \rho(x)dx > 1.5q_c$$

where $\rho(x)$ denotes the charge density in the n-conducting region 4 and $q_c$ denotes the critical charge in the region 4, which is linked to the critical field strength by Maxwell's third equation.

We claim:

1. A method of producing an edge termination suitable for high voltages in a basic material wafer prefabricated according to the principle of lateral charge compensation, which comprises the following steps:

prefabricating a basic material wafer by producing a fixed grid of regions of a first conductivity type and regions of a second conductivity type, opposite to the first condnctivity type, such that charge compensation is substantially present in a lateral direction in the basic material wafer; and introducing a rapidly diffusing dopant into the regions of the basic material wafer thereby defining edge regions of a compensation component to be produced from the basic material wafer, so that, in the edge regions of the compensation component to be produced, a doping of the rapidly diffusing dopant predominates over a doping of the regions of a conductivity type opposite to that of the edge regions.

2. The method according to claim 1, which comprises selectively choosing a dopant of the first or the second conductivity type for the rapidly diffusing dopant.

3. The method according to claim 1, which comprises selecting the dopant from the group consisting of selenium and sulfur.

4. The method according to claim 1, which comprises introducing the dopant by ion implantation via a mask having openings of different widths.

5. The method according to claim 1, which comprises introducing the dopant by ion implantation via a VLD mask.

6. The method according to claim 1, wherein the following relationship holds true in the edge region defined between an edge A and a beginning C of a cell array:

$$\int_C^A \rho(x)dx > 1.5q_c$$

where $\rho(x)$ is a charge density in the edge region and $q_c$ is a critical charge of the edge region.

* * * * *